United States Patent
Wang et al.

(10) Patent No.: US 7,957,188 B2
(45) Date of Patent: Jun. 7, 2011

(54) STRUCTURES AND METHODS OF TRIMMING THRESHOLD VOLTAGE OF A FLASH EEPROM MEMORY

(75) Inventors: Lee Z. Wang, Hsinchu (TW); Jui-Hung Huang, Hsinchu (TW)

(73) Assignee: FS Semiconductor Corp., Ltd., Hsinchu (TW)

( * ) Notice: Subject to any disclaimer, the term of this patent is extended or adjusted under 35 U.S.C. 154(b) by 72 days.

(21) Appl. No.: 12/613,124

(22) Filed: Nov. 5, 2009

(65) Prior Publication Data

US 2011/0103144 A1  May 5, 2011

(51) Int. Cl.
*G11C 16/00* (2006.01)
(52) U.S. Cl. ......... 365/185.03; 365/185.18; 365/185.22; 365/185.24
(58) Field of Classification Search .......... None
See application file for complete search history.

(56) References Cited

U.S. PATENT DOCUMENTS

| | | | | |
|---|---|---|---|---|
| 5,142,496 A | * | 8/1992 | Van Buskirk | 365/201 |
| 5,771,346 A | * | 6/1998 | Norman et al. | 714/42 |
| 5,991,203 A | * | 11/1999 | Choi | 365/185.27 |
| 6,212,103 B1 | * | 4/2001 | Ahrens et al. | 365/185.29 |

* cited by examiner

*Primary Examiner* — Tan T. Nguyen
(74) *Attorney, Agent, or Firm* — Muncy, Geissler, Olds & Lowe, PLLC

(57) ABSTRACT

A method of trimming FET NVM cells in Multi-Level-Cell (MLC) operation is provided. The method comprises (a) applying a first voltage and a second voltage to a control gate and a bulk of the over-programmed FET NVM cell, respectively; and (b) applying a signal to a drain of the over-programmed FET NVM cell for a time period to produce a limited threshold voltage reduction; wherein polarities of the first voltage and the second voltage are opposite to that of the signal. Thus, the charge placement in the storing material could be precisely controlled within a small range of charge state and produce a multi-bits/cell of higher digital storage density.

33 Claims, 16 Drawing Sheets

STRUCTURES AND METHODS OF TRIMMING THRESHOLD VOLTAGE OF A FLASH EEPROM MEMORY

BACKGROUND OF THE INVENTION

1. Field of the Invention

This invention relates to non-volatile flash memory cells in Multi-Level-Cell (MLC) operation, and more particularly, to a method of trimming threshold voltage of FET NVM cells in MLC operation.

2. Description of the Related Art

An Electrical-Erasable-Programmable Read Only Memory (EEPROM) cell is a semiconductor device having non volatile memory properties which can be electrically programmed and erased. EEPROM Non-Volatile Memory (NVM) cell comprises a Field Effect Transistor (FET) with a charge storing material to alter the threshold voltage of the FET. The non volatile memory properties enable the device to retain stored information once the power is turned off. The information is in the form of charges stored within the storing material (as shown in FIGS. 1A and 2A). Moreover, many kinds of EEPROM storage arts were developed (as shown in FIGS. 1B~1E and FIGS. 2B~2E). A "flash" EEPROM is an NVM device can be erased or programmed in a large number of memory cells in one program/erase operation.

Data is stored in a binary format in the NVM cell in a manner that the cell is set to a programmed state and reset to an erased state. Programming the cell is accomplished by storing charges in the storing material usually by means of tunneling or hot carrier injection. Erasing the cell is done by removing the charges from the storing material usually by means of tunneling.

In a single bit operation of an NVM cell, the erased state and programmed state can be assigned to binary code of "1" and "0", respectively, or vice versa. The stored bit information of an NVM cell are represented by the threshold voltage levels of "programmed" and "erased" states of the NVM cell. In an N-bit operation of an NVM cell, $2^N$ threshold voltage levels are required to represent the states of the N-bit binary code. For examples, 2-bit per cell operation requires 4 threshold voltage levels with one erased and three programmed; 4-bit per cell operation requires 16 threshold voltage levels with one erased and fifteen programmed, and so forth.

The goal of the MLC (Multi-Level Cell) storage is enabling multiple threshold voltage operation in single EEPROM cell. The threshold voltage of the NVM cell is altered depending on the amount of charges stored in the storing material. The basic techniques for accurate charge placement and sensing have the three major challenges for multi-bit storage identified:

- Precise Charge Placement: The flash memory cell programming must be very accurately controlled, requiring a detailed understanding of the physics of programming as well as the control and timing of the voltages applied to the cell.
- Precise Charge Sensing: The read operation of an MLC memory is basically an analog to digital conversion of the analog charge stored in the memory cell to digital data, a concept new to memory devices.
- Stable Charge Storage: Meeting the data retention goals would require the stored charge to be stable with a leakage rate of less than one electron per day.

A MLC is usually programmed to a desired threshold voltage level either by injecting certain amount of hot carriers or tunneling charges to the storing material. In programming a plurality of NVM cells in a memory array, the amounts of charges injected into the storing material in programming process vary with a range of distribution for a specific targeted threshold voltage level. The distribution is caused by different physical mechanisms such as the fluctuations of applied programming voltage biases and the non-uniformity of NVM cells from manufacturing process. The threshold voltage distribution of a plurality of NVM cells for a specific level imposes a limitation on the resolvability between threshold voltage levels. To reduce the distribution, a programming-verification process for the lower bound threshold voltage is introduced in the conventional way of programming MLC operation. The threshold voltages of a plurality of NVM cells are repeatedly programmed and verified until the entire targeted NVM cells are above the lower bound threshold voltage for a specific threshold voltage level. However, since there is no high bound threshold voltage limitations for the specific threshold voltage level the over-programmed cells for the level may be higher than the lower bound threshold voltage of its higher neighboring level resulting in misreading the stored bit information. To prevent the undesirable misreading in MLC operation, the separation of threshold levels must increase to a larger margin resulting in the number reduction of threshold voltage levels in an available threshold voltage range.

In order to divide more threshold levels and to meet the reading resolvability for storing more bits in a single cell, an upper bound threshold voltage is set to limit the threshold voltages of over-programmed NVM cells. The threshold voltages of a plurality of NVM cells for a specific threshold voltage level are adjusted to be within the band of the lower and upper bound threshold voltages as shown in FIG. 3 for an example of 4-bit MCL operation. $L_i$ and $H_i$ represent the lower bound and the high bound threshold voltages, respectively for the threshold voltage level i; $S_i$ are the applied voltages to the NVM control gate for i=0, . . . , 14, for probing the 16 threshold voltage levels. It is known that when a voltage applied to the control gate voltage of an NVM cell is above its threshold voltage the NVM cell will be turned on. As illustrated in FIG. 3 when the applied control gate voltages change from $S_{i-1}$ to $S_i$ the NVM cells with threshold voltages within the band of the level i will be turned from "off" state to ""on" state. Therefore, the transition of NVM off-on process can be used as a digital signature of the storing information represented by 4 digital bits ($2^4$=16 levels of distinctive threshold voltage bands).

To program and to trim a plurality of NVM threshold voltages to the threshold voltage band for a level i require programming and trimming methods to NVM cells. The conventional programming methods, either tunneling or hot carrier injection, tend to increase the threshold voltages of NVM cells with increasing number of programming pulse shots. The threshold voltage increments also become smaller and smaller as the number of pulse shots increases. The conventional programming methods are sufficient for the lower bound threshold voltage adjustment. However, since the over-programmed NVM cells require to be trimmed down within the threshold voltage band of a specific level i, the trimming threshold voltage increments must be smaller than the threshold voltage band width of the level to prevent over-trimmed NVM threshold voltages below the lower bound of the threshold voltage band.

To lower the threshold voltages of programmed NVM cells is done by removing the stored charges from the storing materials. The conventional way of removing the stored charges is either by tunneling out the stored charges or by injecting hot carriers with opposite charge. However, those processes down-shift the programmed NVM threshold voltages too far lower threshold voltages from the programmed states. Usually, the threshold voltages reach the erased state after several conventional erasing shots. The conventional charge removing process is not able to trim down the threshold voltages of programmed NVM cells with a sufficient small threshold voltage increment. In this disclosure, we provide threshold voltage trimming methods to trim down the threshold voltages of a plurality of programmed NVM cells with small threshold voltage increments. The down-shifted threshold voltage increment can be adjusted to be small enough such that the threshold voltages of a plurality of NVM cells guarantee to be within the desired threshold voltage band for a specific level in MLC operation.

SUMMARY OF THE INVENTION

The main aspect of this invention is to provide methods of trimming threshold voltage of FET NVM cells in MLC operation. With both the trimming-down methods of the present invention for the upper bound threshold voltage limit, and the conventional programming methods for the lower bound threshold voltage limit, the charge placement in the storing material for a plurality of NVM cells could be precisely controlled within a small range of a specific charge state and leads to a multi-bits/cell of higher digital storage density.

Throughout the specification and claims, the term "trimming" refers to a method for trimming down the threshold voltage of over-programmed FET NVM cells for a specific threshold voltage level.

The conventional FET NVM cells comprise a body terminal having a conductivity type, a source terminal and a drain terminal having an opposite conductivity type, a charge storing material electrically isolated and having electric charge retention properties, and a control terminal electrically isolated from the charge storing material and constructed in a manner to have an electric coupling to the charge storing material.

The trimming method in the present invention comprising of the following steps:

For N-type Field Effect Transistor (NFET) based EEPROMs with electrons stored in the storing material,
1. Applying negative voltage biases, Vgneg and Vbneg to the control gate terminal and body terminal, respectively,
2. Applying a voltage pulse with positive voltage amplitude Vdpos for a time period Tpuls.to the drain terminal (FIG. 5A).

Alternatively,
1. Applying a positive voltage bias Vdpos and a negative voltage bias Vbneg to the drain terminal and body terminal, respectively.
2. Applying a voltage pulse with negative voltage amplitude Vgneg for a time period Tpuls to the control gate terminal (FIG. 5B).

For P-type Field Effect Transistor (PFET) based EEPROMs with holes stored in the storing material,
1. Applying positive voltage biases, Vgpos and Vbpos to the control gate terminal and body terminal, respectively.
2. Applying a voltage pulse with negative voltage amplitude Vdneg for a btime period Tpuls.to the drain terminal (FIG. 6A).

Alternatively,
1. Applying a negative voltage bias Vdneg and a positive voltage bias Vnpos to the drain terminal and body terminal, respectively.
2. Applying a voltage pulse with positive voltage amplitude Vgpos for a time period Tpuls to the control gate terminal (FIG. 6B).

The control gate voltage magnitude Vg, drain voltage magnitude Vd, and body voltage magnitude Vb, are determined according to the following procedures:
1. Program the NVM cell to the highest threshold level, that is, most amounts of electrons in the storing material for NFET and most amounts of holes in the storing material in PFET, respectively.
2. For a given drain voltage with opposite polarity to control gate voltage and body voltage, the body voltage is adjusted with a chosen control gate voltage such that the reversed bias of the body-drain junction generates band to band tunneling to cause the stored charges to be annihilated in or released from the storing material leading to a desirable threshold voltage reduction in the NVM cell for the highest level with the shortest available pulse duration.
3. With the same voltage bias condition and voltage pulse amplitude, the pulse durations are increased for the lower threshold levels such that the threshold reductions in NVM cell for different lower levels meet the same desirable criterion of threshold voltage reduction.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

The present invention includes methods and schematics to trim down the over-programmed NVM cells in MLC operation. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 1A:
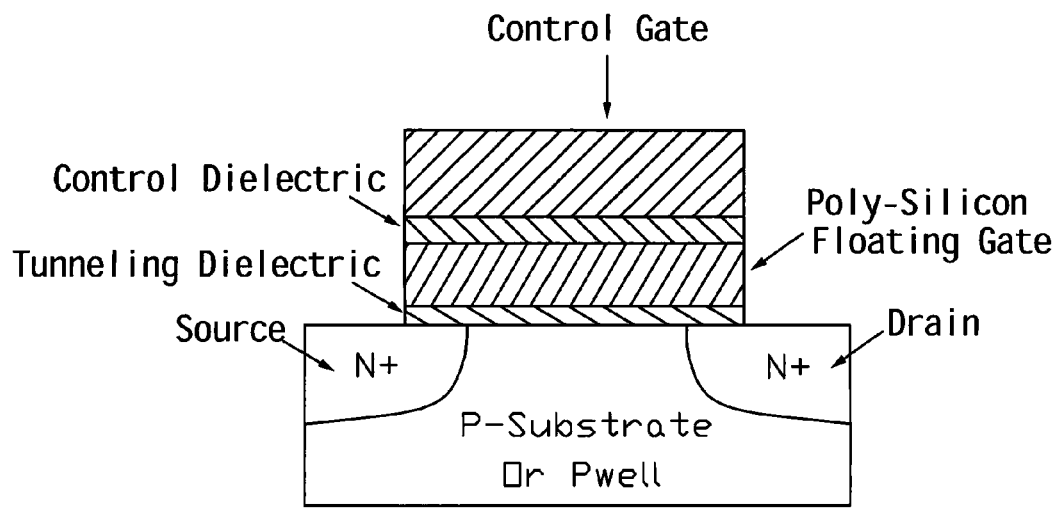
FIGS. 1A~1E show typical cross-sectional views of NFET based EEPROM cells with different architectures.
Figure 1B:
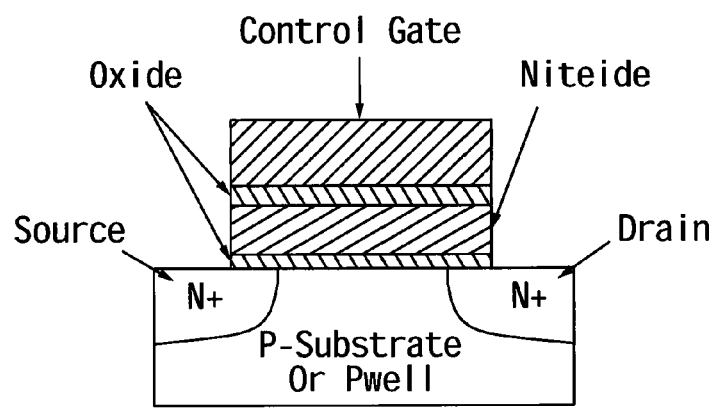
Figure 1C:
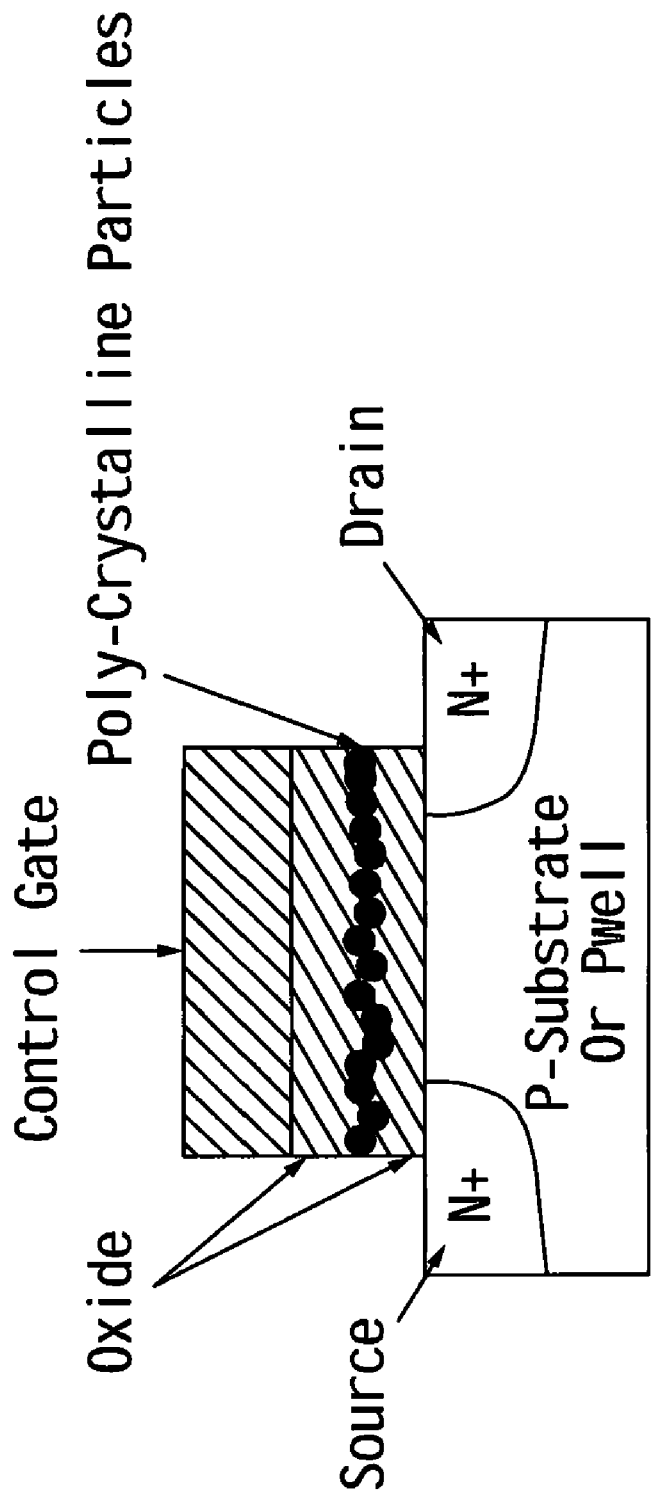
Figure 1D:
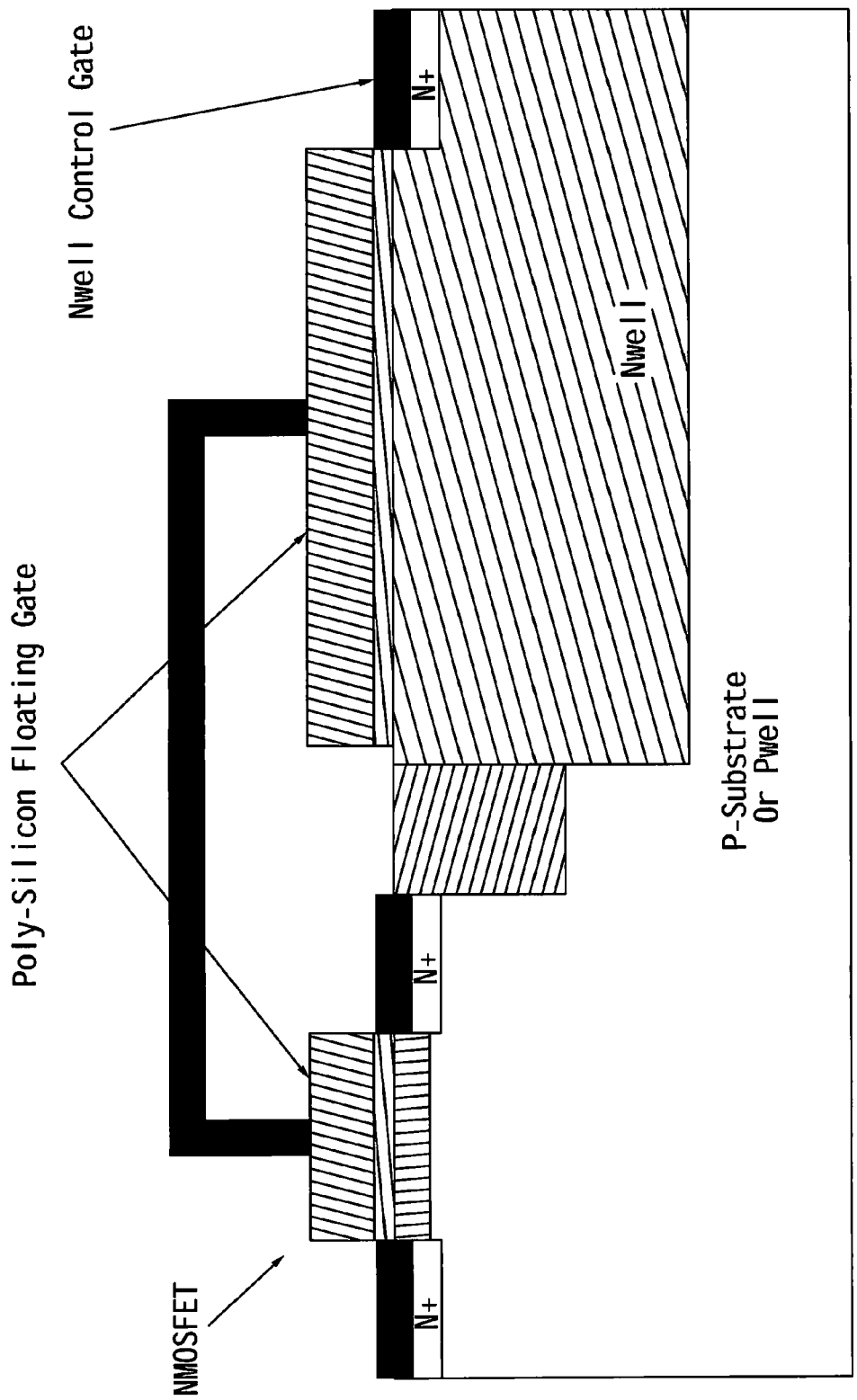
Figure 1E:
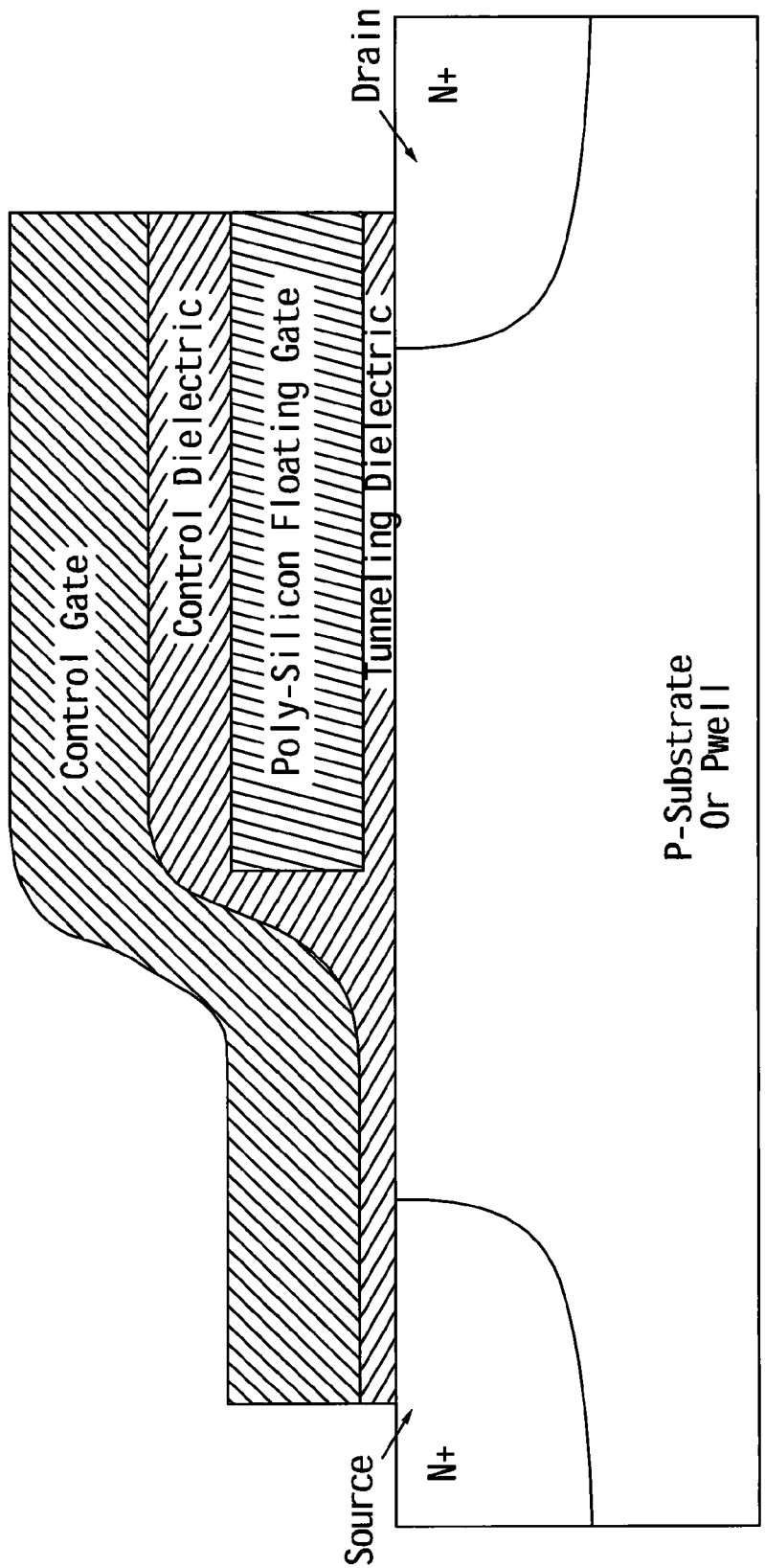
Figure 2A:
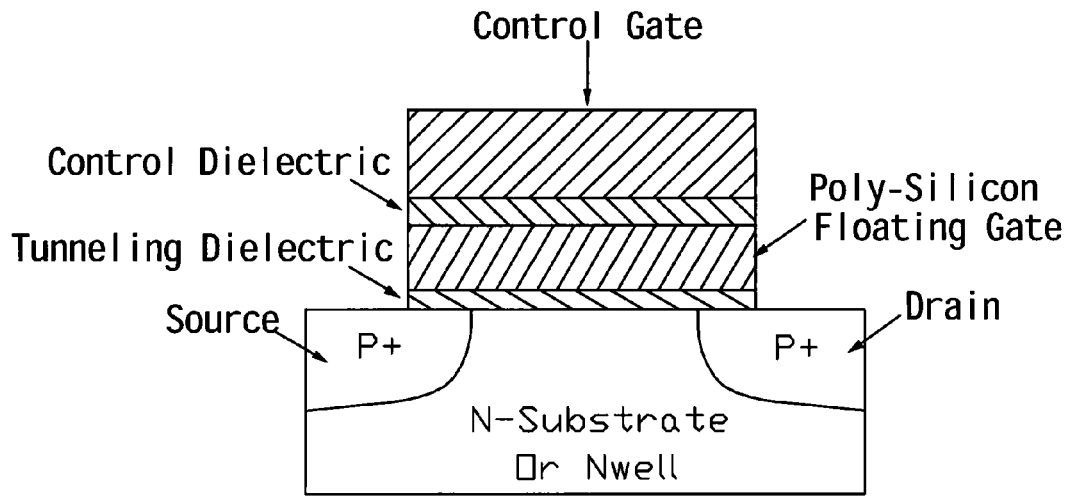
FIGS. 2A~2E show typical cross-sectional views of PFET based EEPROM cells with different architectures.
Figure 2B:
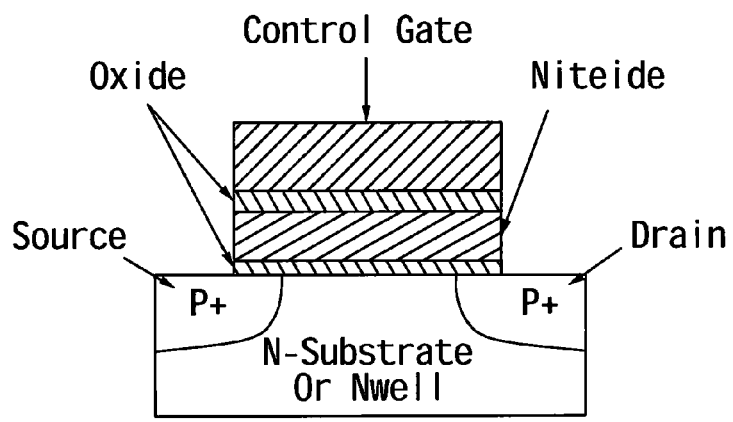
Figure 2C:
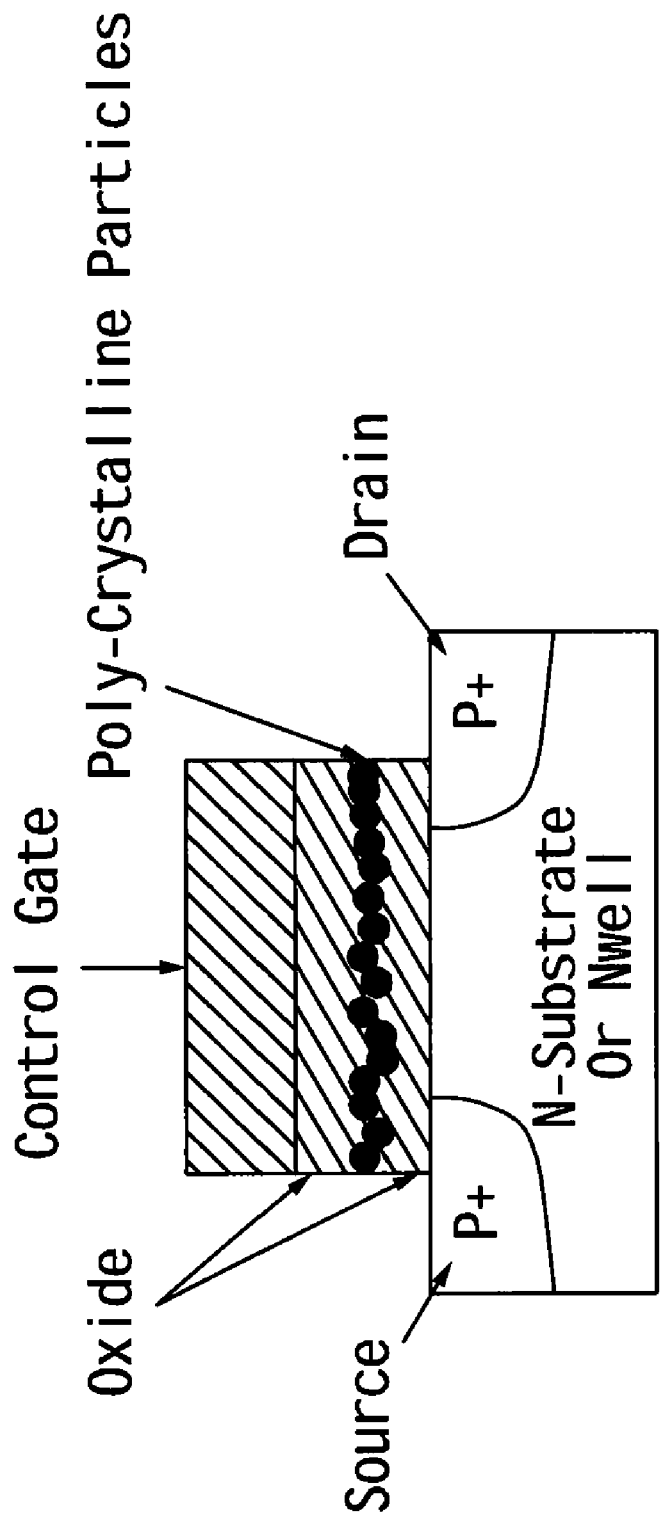
Figure 2D:
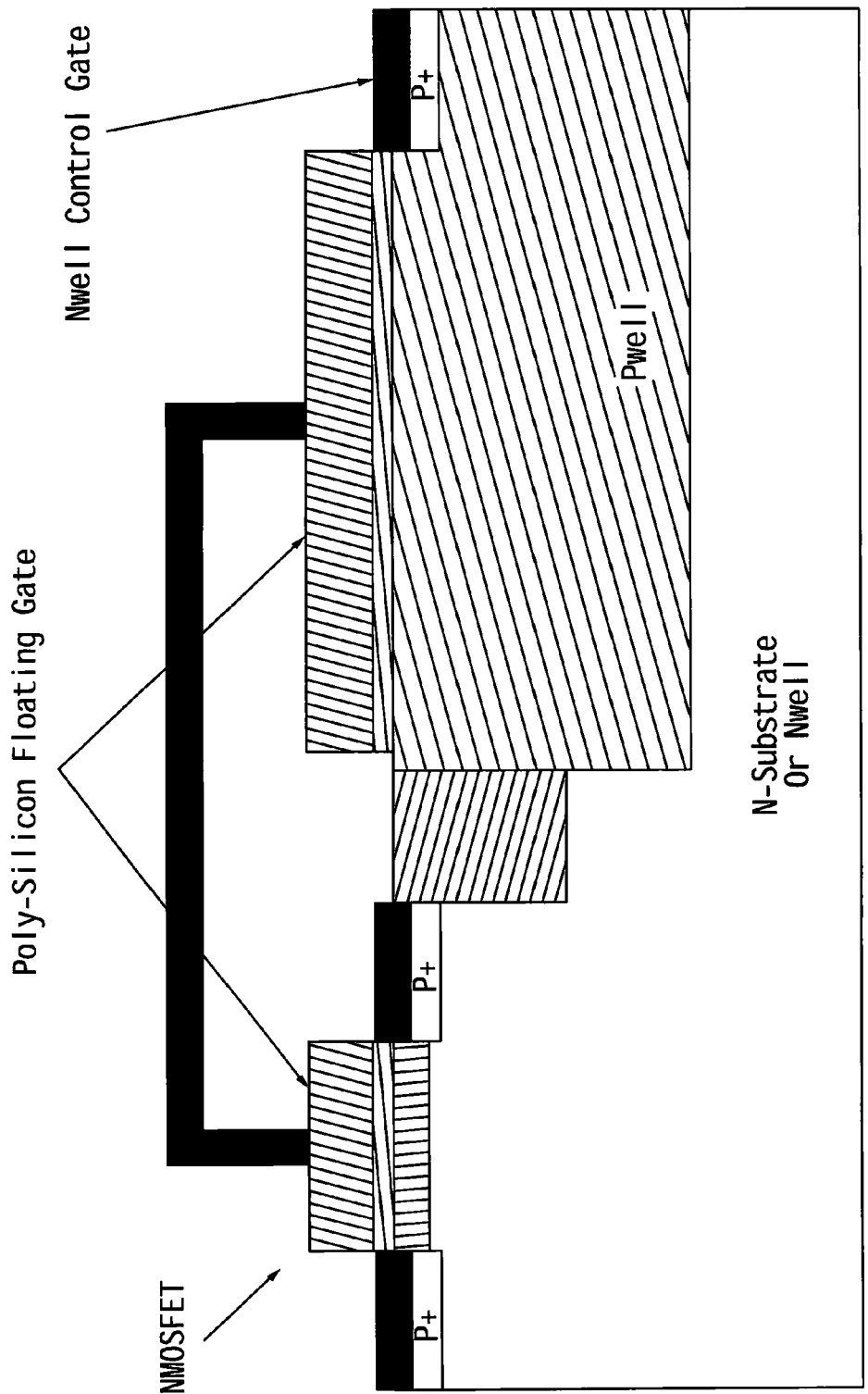
Figure 2E:
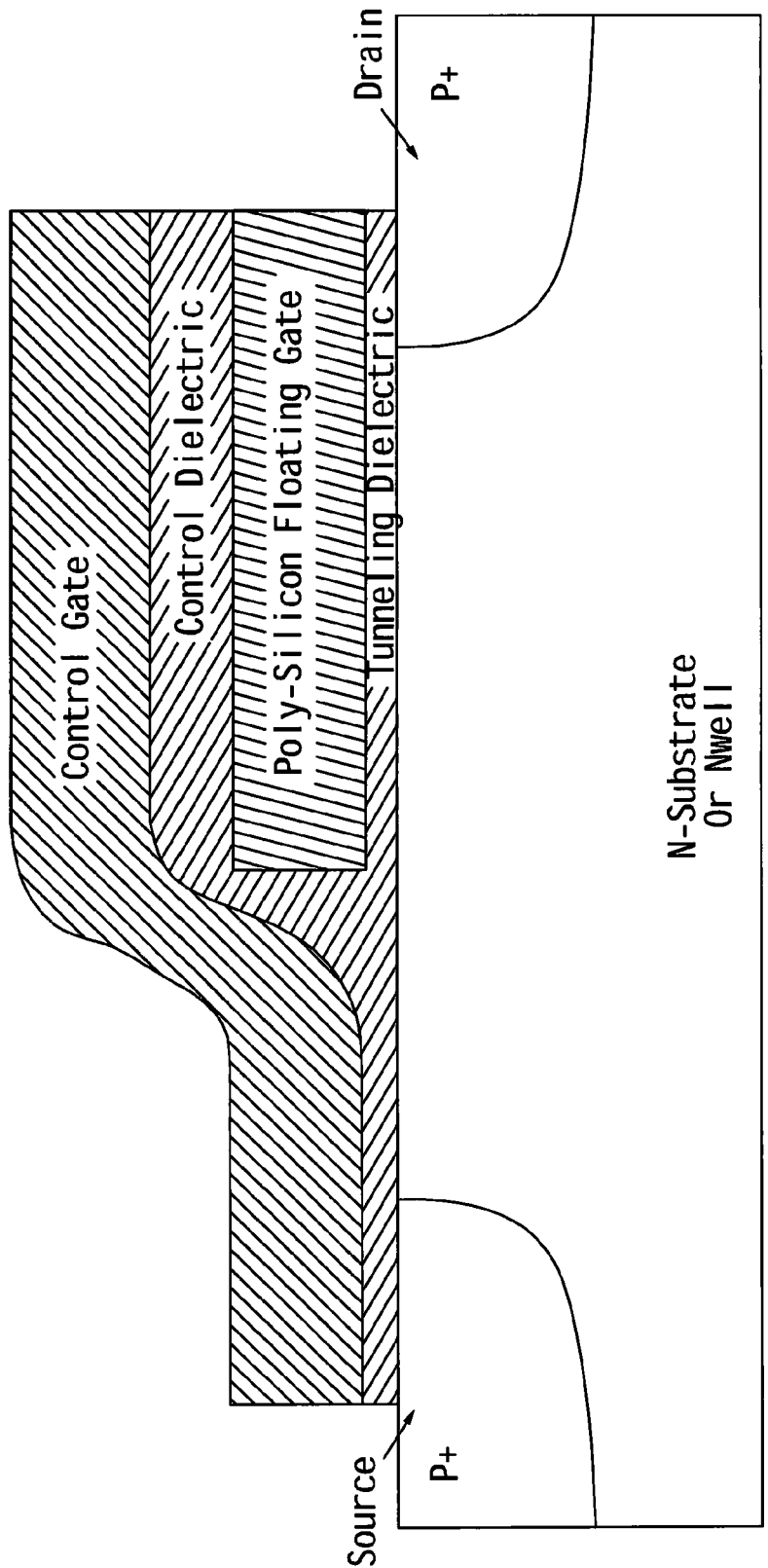
Figure 3:
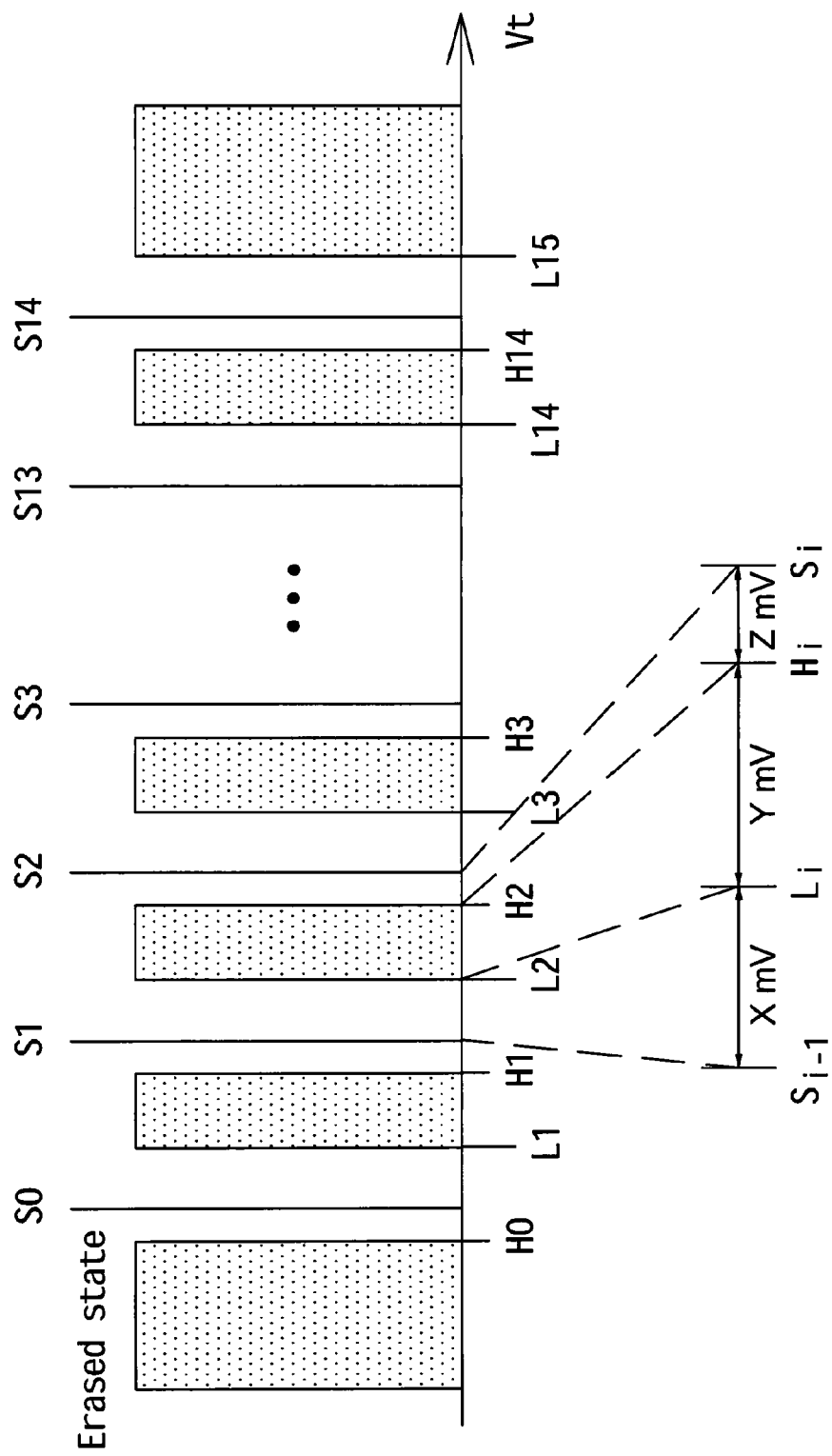
FIG. 3 illustrates the MLC window diagrams for one of the embodiments for a 4-bit per cell NVM. The trimming is to adjust down the targeted threshold voltage to be below the high bound limits for the levels
Figure 4A:
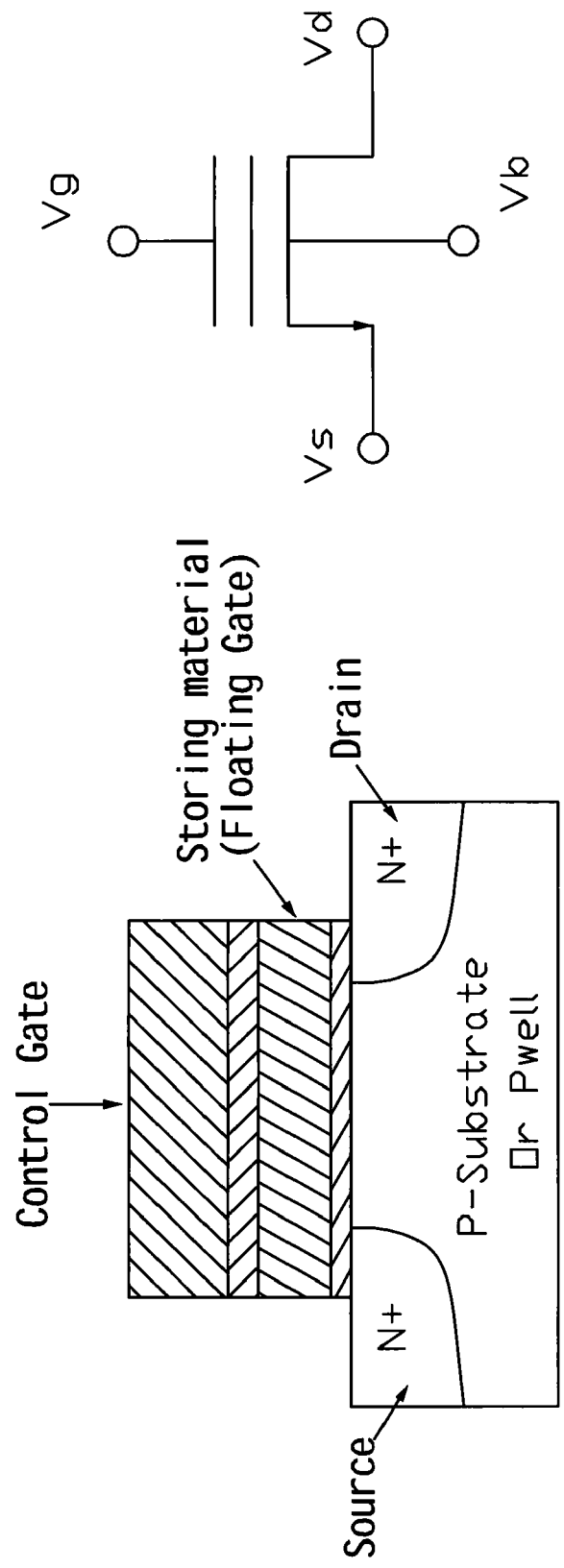
FIGS. 4A and 4B show N channel and P channel EEPROMs, respectively, and equivalent circuit terminals for an NFET and a PFET.
Figure 4B:
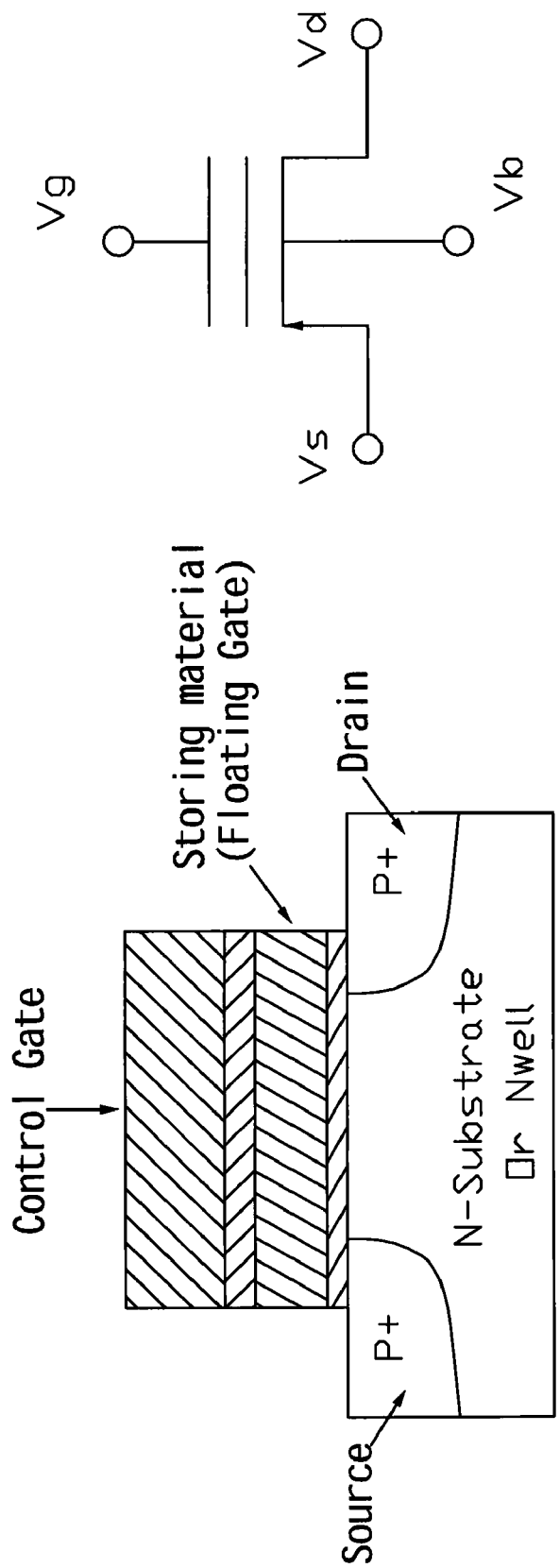
Figure 5A:
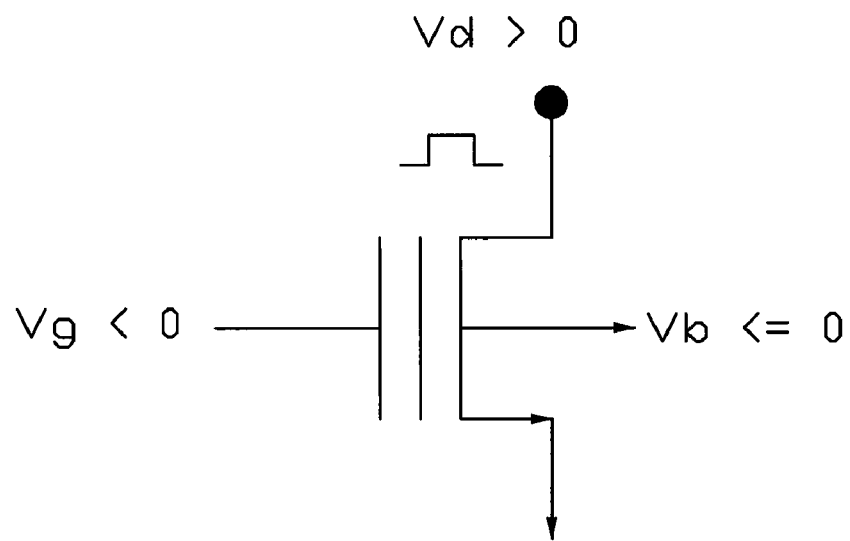
FIG. 5 illustrates the trimming processes for an NFET based EEPROM by (a) applying negative voltage biases to control gate terminal and body terminal, respectively, and applying a positive voltage pulse to drain terminal; (b) applying a negative voltage pulse on the control gate with a negative voltage bias on body terminal and a positive voltage bias on the drain terminal.
Figure 9:
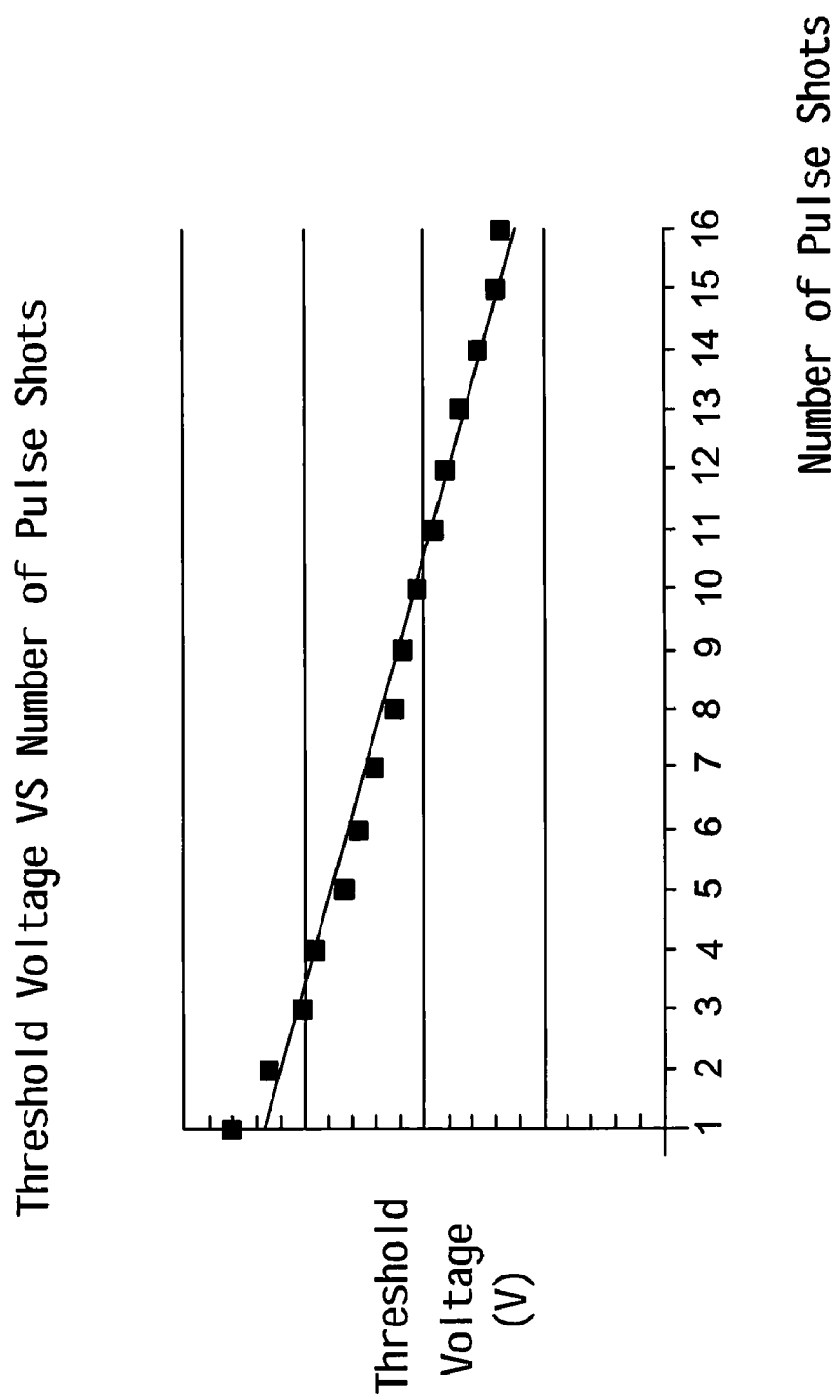
FIG. 9 shows the measured threshold voltage curves versus the number of trimming pulses for an N-type floating gate FET NVM device manufactured with 0.13 μm process technology, wherein the pulse duration is in the range of 0.2 μs to 100 μs for all threshold voltage levels and the threshold voltage reduction step is about 10 mV per pulse shot.

To illustrate this embodiment, NVM cells structured with poly floating gate (FIGS. 4A and 4B) and manufactured with 0.13 μm process technology are applied with the current invention. However, this invention is not limited by type of NVM cell, generation of process technology or charge storing material such as nitride film or nano-crystal layer. An N-type NVM cell is programmed the highest threshold voltage level ~9V using a programming method. The NVM cell is set up as the schematic shown in FIG. 5A. The amplitude for drain voltage and control gate voltage bias set to be 2.7V and −6V, respectively. The pulse duration set to be 0.2 μs. It is experimentally shown that when the body bias is adjusted to −4V the threshold voltage reduction for the NVM is about 10 mV per pulse shot as shown in FIG. 9. With the same voltage biases and pulse amplitude, the pulse durations are adjusted to below levels to meet the criterion of ~10 mV per pulse shot. The pulse durations are increased to 100 μs for a level near the cell intrinsic threshold voltage, that is, the NVM threshold voltage obtained with no stored charges (electrons or holes) on the floating gate.

Figure 5B:
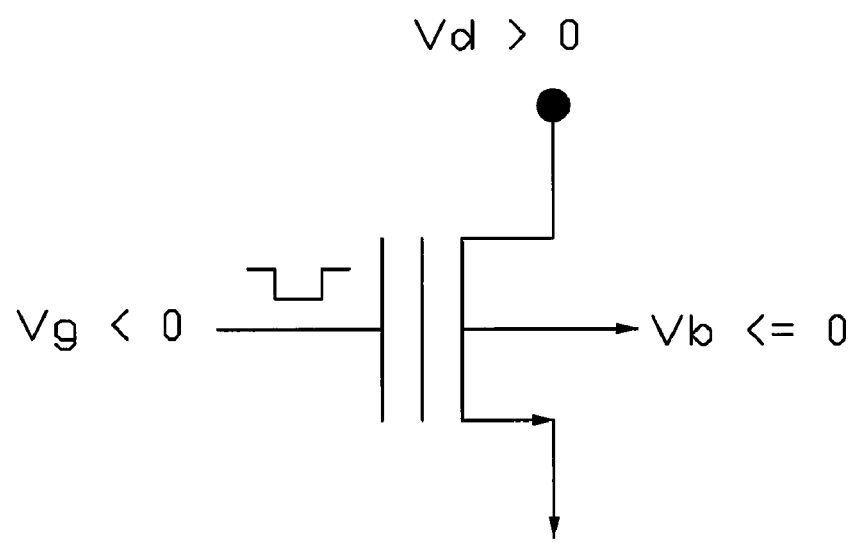
Figure 6A:
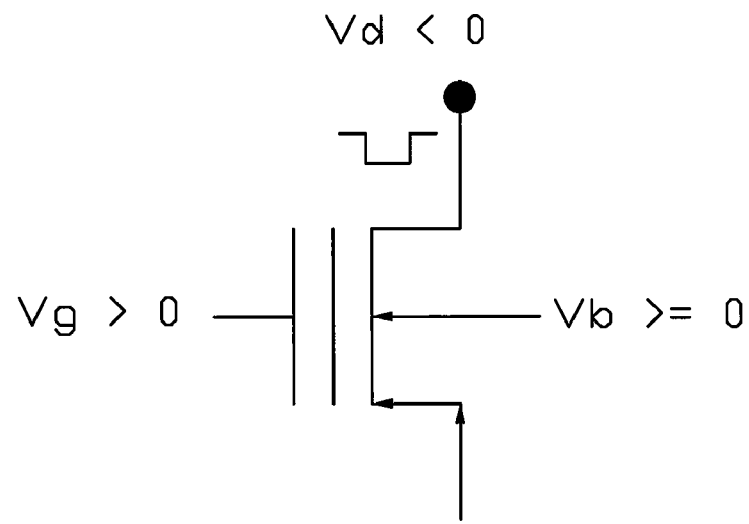
FIG. 6 illustrates the trimming processes for a PFET based EEPROM by (a) applying positive voltage biases to control gate terminal and body terminal, respectively, and applying a negative voltage pulse to drain terminal; (b) applying a positive voltage pulse on the control gate with a positive voltage bias on body terminal and a negative voltage bias on the drain terminal.
Figure 6B:
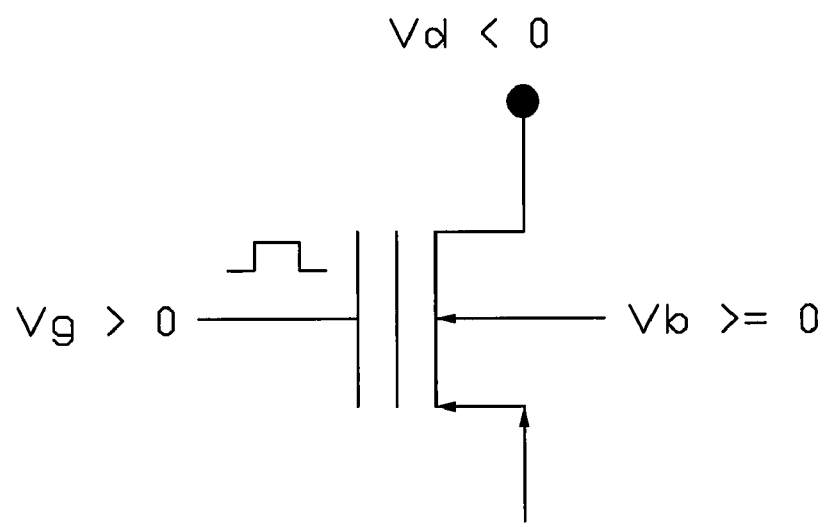
Figure 7:
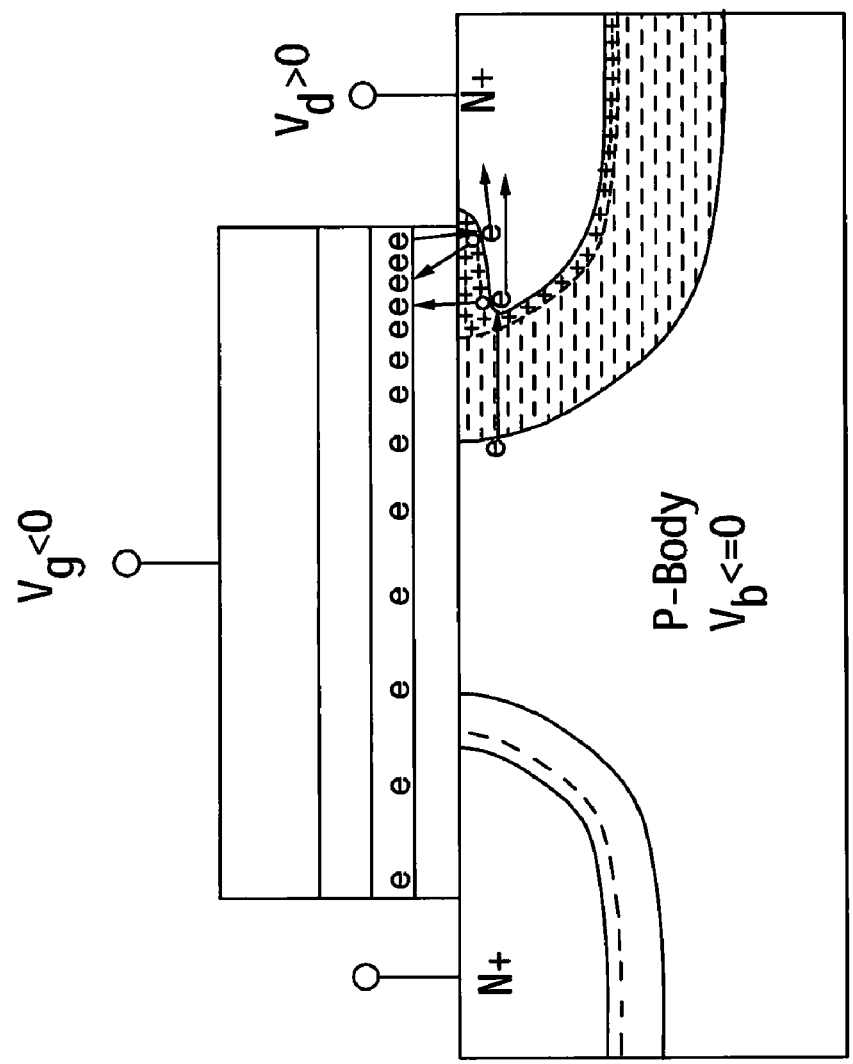
FIG. 7 show cross-sectional views of the electrical process for trimming down over-programmed threshold voltage for a NFET based EEPROM.
Figure 8:
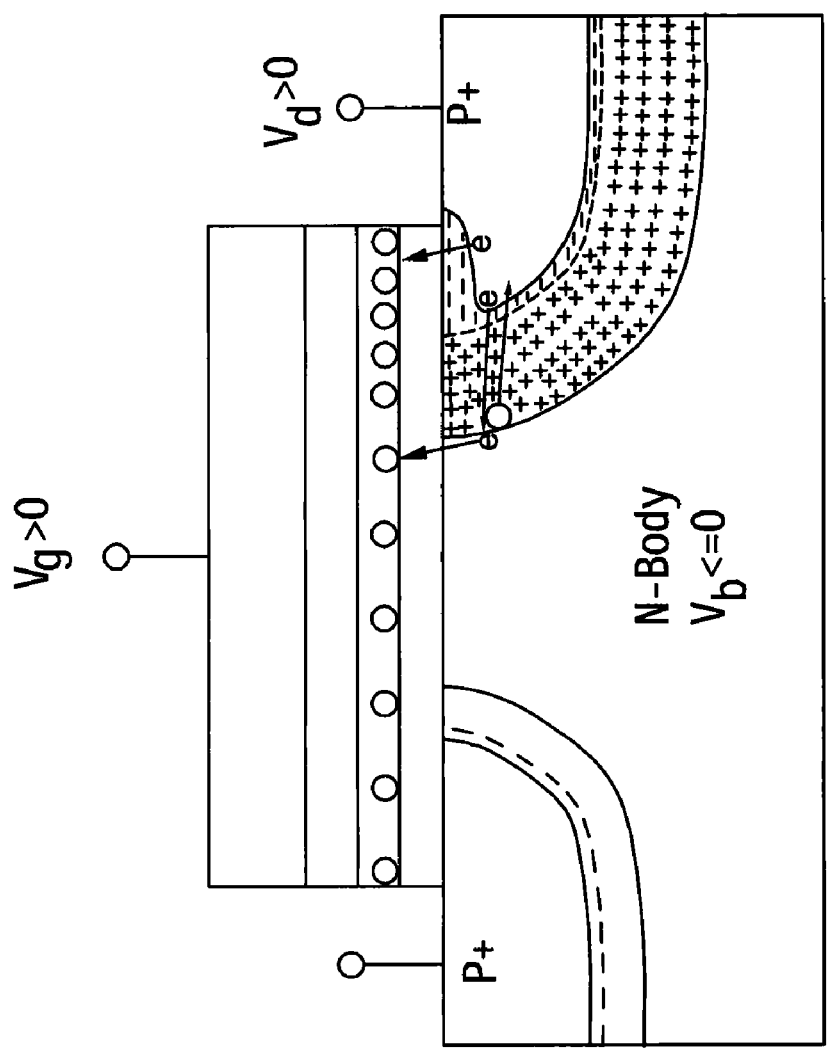
FIG. 8 show cross-sectional views of the electrical process for trimming down over-programmed threshold voltage for a PFET based EEPROM.

In the other embodiment, an N-type NVM cell is programmed the highest threshold voltage level ~9V using programming method. The NVM cell is set up as the schematic shown in FIG. 5B. The drain and body voltage biases set to be 2.7V and −4V, respectively. The pulse duration set to be 0.2 μs. It is experimentally shown that when the gate voltage pulse amplitude is −6V the threshold voltage reduction for the NVM is about 10 mV per pulse shot. With the same drain and body voltage biases and control gate voltage pulse amplitude, the pulse durations are adjusted to below levels to meet the criterion of ~10 mV per pulse shot. The pulse durations are increased to 100 μs for a level near the cell intrinsic threshold voltage, that is, the NVM threshold voltage obtained with no stored charges (electrons or holes) on the floating gate.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A method of trimming an over-programmed FET NVM cell, comprising:

applying a first voltage and a second voltage to a control gate and a bulk of the over-programmed FET NVM cell, respectively; and applying a signal to a drain of the over-programmed FET NVM cell for a time period to produce a limited threshold voltage reduction;

wherein polarities of the first voltage and the second voltage are opposite to that of the signal.

2. The method according to claim 1, wherein the signal is a voltage pulse.

3. The method according to claim 1, wherein the second voltage comprises a ground voltage or a voltage with the same polarity of the first voltage.

4. The method according to claim 1, wherein the over-programmed FET NVM cell has a plurality of memory states and each memory state corresponds to a threshold voltage level, and wherein each threshold voltage level has a first bound and a second bound and the limited threshold voltage reduction is less than a voltage difference between the first bound and the second bound of a threshold voltage level corresponding to a selected memory state.

5. The method according to claim 1, wherein the polarities of the first voltage and the second voltage are negative if the over-programmed FET NVM cell is a NFET NVM cell.

6. The method according to claim 1, wherein the polarities of the first voltage and the second voltage are positive if the over-programmed FET NVM cell is a PFET NVM cell.

7. The method according to claim 1, wherein the limited threshold voltage reduction is adjustable by the time period and amplitudes of the first voltage, the second voltage and the signal.

8. The method according to claim 1, wherein the time period is related to a threshold voltage of the over-programmed FET NVM cell if the limited threshold voltage reduction and amplitudes of the first voltage, the second voltage and the second signal are fixed.

9. A method of trimming an over-programmed FET NVM cell, comprising:

applying a first voltage and a second voltage to a drain and a bulk of the over-programmed FET NVM cell, respectively; and applying a signal to a control gate of the over-programmed FET NVM cell for a time period to produce a limited threshold voltage reduction;

wherein the polarities of the signal and the second voltage are opposite to that of the first voltage.

10. The method according to claim 9, wherein the signal is a voltage pulse.

11. The method according to claim 9, wherein the second voltage comprises a ground voltage or a voltage with the same polarity of the signal.

12. The method according to claim 9, wherein the over-programmed FET NVM cell has a plurality of memory states and each memory state corresponds to a threshold voltage level, and wherein each threshold voltage level has a first bound and a second bound and the limited threshold voltage reduction is less than a voltage difference between the first bound and the second bound of a threshold voltage level corresponding to a selected memory state.

13. The method according to claim 9, wherein the polarity of the first voltage is positive if the over-programmed FET NVM cell is a NFET NVM cell.

14. The method according to claim 9, wherein the polarity of the first voltage is negative if the over-programmed FET NVM cell is a PFET NVM cell.

15. The method according to claim 9, wherein the limited threshold voltage reduction is adjustable by the time period and amplitudes of the first voltage, the second voltage and the signal.

16. The method according to claim 9, wherein the time period is related to a threshold voltage of the over-programmed FET NVM cell if the limited threshold voltage reduction and amplitudes of the first voltage, the second voltage and the second signal are fixed.

17. A method of programming a FET NVM cell having a plurality of memory states, each memory state corresponding to a threshold voltage level, comprising:
applying at least a first signal for increasing a threshold voltage of the FET NVM cell;
comparing the threshold voltage of the FET NVM cell with a predetermined voltage level; and
applying a first voltage, a second voltage and a second signal to the FET NVM cell to produce a limited threshold voltage reduction when the threshold voltage of the FET NVM cell is greater than the predetermined voltage level;
wherein one of the first voltage, the second voltage and the second signal has a polarity opposite to those of the others.

18. The method of claim 17, wherein each threshold voltage level has a first bound and a second bound and the second bound is greater than the first bound, and wherein the limited threshold voltage reduction is less than a voltage difference between the first bound and the second bound.

19. The method of claim 18, wherein the predetermined voltage level is a first bound of a threshold voltage level corresponding to a selected memory state.

20. The method of claim 17, wherein the step of applying the first voltage, the second voltage and the second signal to the FET NVM cell comprises:
applying the first voltage and the second voltage to a control gate and a bulk of the FET NVM cell, respectively; and
applying the second signal to a drain of the FET NVM cell for a time period to produce the limited threshold voltage reduction;
wherein the polarities of the first voltage and the second voltage are opposite to that of the second signal.

21. The method according to claim 20, wherein the second signal is a voltage pulse.

22. The method according to claim 20, wherein the second voltage comprises a ground voltage or a voltage with the same polarity of the first voltage.

23. The method according to claim 20, wherein the polarities of the first voltage and the second voltage are negative if the FET NVM cell is a NFET NVM cell.

24. The method according to claim 20, wherein the polarities of the first voltage and the second voltage are positive if the FET NVM cell is a PFET NVM cell.

25. The method according to claim 20, wherein the limited threshold voltage reduction is adjustable by the time period and amplitudes of the first voltage, the second voltage and the second signal.

26. The method according to claim 20, wherein the time period is related to the threshold voltage of the FET NVM cell if the limited threshold voltage reduction and amplitudes of the first voltage, the second voltage and the second signal are fixed.

27. The method of claim 17, wherein the step of applying the first voltage, the second voltage and the second signal to the FET NVM cell comprises:
applying the first voltage and the second voltage to a drain and a bulk of the FET NVM cell, respectively; and
applying the second signal to a control gate of the FET NVM cell for a time period to produce the limited threshold voltage reduction;
wherein the polarities of the second signal and the second voltage are opposite to that of the first voltage.

28. The method according to claim 27, wherein the second signal is a voltage pulse.

29. The method according to claim 27, wherein the second voltage comprises a ground voltage or a voltage with the same polarity of the second signal.

30. The method according to claim 27, wherein the polarity of the first voltage is positive if the FET NVM cell is a NFET NVM cell.

31. The method according to claim 27, wherein the polarity of the first voltage is negative if the FET NVM cell is a PFET NVM cell.

32. The method according to claim 27, wherein the limited threshold voltage reduction is adjustable by the time period and amplitudes of the first voltage, the second voltage and the second signal.

33. The method according to claim 27, wherein the time period is related to the threshold voltage of the FET NVM cell if the limited threshold voltage reduction and amplitudes of the first voltage, the second voltage and the second signal are fixed.

* * * * *